(12) United States Patent
Xie et al.

(10) Patent No.: US 12,280,929 B2
(45) Date of Patent: Apr. 22, 2025

(54) PACKAGING MATERIAL FOR NON-DESTRUCTIVE DETECTION OF FOOD QUALITY, PREPARATION METHOD OF PACKAGING MATERIAL, AND DETECTION METHOD USING PACKAGING MATERIAL

(71) Applicant: ZHEJIANG UNIVERSITY, Hangzhou (CN)

(72) Inventors: Lijuan Xie, Hangzhou (CN); Yingli Wang, Hangzhou (CN); Yibin Ying, Hangzhou (CN); Xiangjiang Liu, Hangzhou (CN); Lin Li, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 6 days.

(21) Appl. No.: 18/034,089

(22) PCT Filed: Sep. 8, 2021

(86) PCT No.: PCT/CN2021/117104
§ 371 (c)(1),
(2) Date: Apr. 27, 2023

(87) PCT Pub. No.: WO2022/267229
PCT Pub. Date: Dec. 29, 2022

(65) Prior Publication Data
US 2023/0391521 A1    Dec. 7, 2023

(30) Foreign Application Priority Data

Jun. 24, 2021   (CN) .......................... 202110704597.8

(51) Int. Cl.
*B65D 65/40* (2006.01)
*C23C 14/08* (2006.01)
(Continued)

(52) U.S. Cl.
CPC ............ *B65D 65/40* (2013.01); *C23C 14/086* (2013.01); *C23C 14/34* (2013.01);
(Continued)

(58) Field of Classification Search
CPC .... B65D 65/40; G01N 21/3586; G01N 21/65; G01N 21/658; Y02W 90/10;
(Continued)

(56) References Cited

U.S. PATENT DOCUMENTS 4,003,709 A * 1/1977 Eaton ..................... G01N 31/22
                                                  422/86
4,285,697 A * 8/1981 Neary .................... G01N 33/02
                                                  422/417
(Continued)

FOREIGN PATENT DOCUMENTS

| CN | 101137898 A | 3/2008 |
| CN | 101716839 A | 6/2010 |
| CN | 109060762 A | 12/2018 |

*Primary Examiner* — Jonathan M Hansen
(74) *Attorney, Agent, or Firm* — Bayramoglu Law Offices LLC

(57) ABSTRACT

A packaging material for the non-destructive detection of food quality, a preparation method of the packaging material, and a detection method using the packaging material are provided. The packaging material includes a film material covering the outside of the food, where the film material includes a flexible base layer, an adhesive layer, a transparent conductive layer, and a nanostructured layer which are sequentially stacked from the outer side to the inner side. The flexible base layer is a polydimethylsiloxane (PDMS) layer. The adhesive layer is a polyimide (PI) layer. The transparent conductive layer is an indium tin oxide (ITO) layer. The nanostructured layer is a silver nanoparticles layer. The preparation method includes spin-coating and
(Continued)

curing PI on PDMS, sputtering ITO, self-assembling silver nanoparticles on the transparent conductive layer, and etching according to a pattern.

10 Claims, 2 Drawing Sheets

(51) Int. Cl.
    *C23C 14/34*     (2006.01)
    *C23C 14/58*     (2006.01)
    *G01N 21/3586*     (2014.01)
    *G01N 21/65*     (2006.01)

(52) U.S. Cl.
    CPC ..... *C23C 14/5873* (2013.01); *G01N 21/3586* (2013.01); *G01N 21/65* (2013.01)

(58) Field of Classification Search
    CPC ......... B32B 27/283; B32B 7/12; B32B 15/00; B32B 15/08; B32B 33/00; B32B 37/00; B32B 37/12; B32B 2037/243; B32B 2307/40; B32B 2439/70
    See application file for complete search history.

(56) References Cited

U.S. PATENT DOCUMENTS

| | | | |
|---|---|---|---|
| 5,407,829 A * | 4/1995 | Wolfbeis | G01N 31/22 436/1 |
| 8,330,951 B2 * | 12/2012 | Li | G01N 21/658 436/171 |
| 2010/0171949 A1 * | 7/2010 | Mazur | B65D 79/02 356/301 |
| 2012/0276549 A1 | 11/2012 | Cunningham et al. | |
| 2017/0074850 A1 * | 3/2017 | Kiryukhin | G01N 33/12 |
| 2019/0002179 A1 * | 1/2019 | Rosqvist | B32B 27/10 |
| 2023/0393063 A1 * | 12/2023 | Xie | G01N 21/3581 |

* cited by examiner

PACKAGING MATERIAL FOR NON-DESTRUCTIVE DETECTION OF FOOD QUALITY, PREPARATION METHOD OF PACKAGING MATERIAL, AND DETECTION METHOD USING PACKAGING MATERIAL

CROSS REFERENCE TO THE RELATED APPLICATIONS

This application is the national phase entry of International Application No. PCT/CN2021/117104, filed on Sep. 8, 2021, which is based upon and claims priority to Chinese Patent Application No. 202110704597.8, filed on Jun. 24, 2021, the entire contents of which are incorporated herein by reference.

TECHNICAL FIELD

The present disclosure relates to a preparation method of a packaging material for non-destructive detection of food quality and a detection method using the packaging material, and in particular, to a preparation method of a packaging material capable of amplifying a spectral signal and a quality detection method for food in intact packaging.

BACKGROUND

Food packaging materials refer to paper, bamboo, wood, metal, enamel, ceramic, plastic, rubber, natural fiber, chemical fiber, glass products, etc. used for packaging and holding food or food additives, and coatings that directly contact food or food additives. All kinds of food must be packaged to maintain the quality of the food and prevent the food from deteriorating during storage, distribution, and sale of the food; microbial contamination; and chemical and physical changes. To meet the needs of food packaging, packaging materials are classified into metal cans, glass bottles, paper containers, plastic packages, etc., depending on the types of food. However, these packaging materials can only protect food but cannot provide for detection of the food. To ensure the quality and edibility of food contained in the packaging material, the detection of the food in the packaging material is especially important. A traditional detection method is to perform manual sampling by destroying the packaging material for sample pretreatment, which causes much sample waste, takes a long time for detection, and cannot realize online real-time detection.

Spectral detection technology is widely used in the non-destructive detection of food quality due to its advantages of short detection time, simple operation, and non-destructiveness. However, ordinary food packaging materials do not consider the requirement of spectral detection during production and cannot be directly used for spectral detection. Direct non-destructive quality detection of food in the packaging material requires to design a packaging material that can amplify the spectral signal. This will not only greatly improve the efficiency of food detection but also maintain food integrity without influencing the secondary sales of food.

SUMMARY

A technical problem to be solved by the present disclosure is to overcome the above-mentioned deficiencies of the related art and to prepare a special food packaging material for spectral detection of food without opening the packaging material. The packaging material features high flexibility, high sensitivity, and fast and convenient detection. The present disclosure further develops a related spectral imaging method, which is simple and fast to use and suitable for various detection needs.

The packaging material of the present disclosure can utilize its structure to amplify a detection signal in an intact condition to realize non-destructive detection of food quality. The detection method of the present disclosure can image the packaging material, is simple and fast to use, and is suitable for various detection needs.

The present disclosure adopts the following technical solutions.

1. A packaging material for non-destructive detection of food quality includes:

a film material covering the outside of food, where the film material includes a flexible base layer, an adhesive layer, a transparent conductive layer, and a nanostructured layer all of which are sequentially stacked from an outer side to an inner side. The nanostructured layer is close to the inner side, and the flexible base layer is close to the outer side. The flexible base layer is a polydimethylsiloxane (PDMS) layer. The adhesive layer is a polyimide (PI) layer. The transparent conductive layer is an indium tin oxide (ITO) layer. The nanostructured layer is a silver nanoparticles layer.

In the present disclosure, a layer of PI is spin-coated on the flexible base layer made of the PDMS, and a layer of ITO film is sputtered on the PI to form the transparent conductive layer. Nanoparticles are self-assembled on the transparent conductive layer to form the nanostructured layer. The transparent conductive layer and the nanostructured layer are configured to amplify a spectral signal to realize non-destructive detection of food quality.

Specifically, the transparent conductive layer is configured to amplify a terahertz spectral signal, and the nanoparticle layer is configured to amplify a Raman spectral signal.

The flexible base layer, the adhesive layer, and the transparent conductive layer are transparent.

The ITO film has desired electrical conductivity and optical transparency and is generally fabricated by sputtering deposition. Ordinary flexible bases are not resistant to high temperatures, so direct sputtering deposition of the ITO will cause deformation such as wrinkles. In the present disclosure, the PI serves as the adhesive layer to bond the flexible base layer and the transparent conductive layer. In this way, when the ITO is deposited by sputtering, the flexible base layer covering the PI layer is not easily deformed, is resistant to high temperatures, and is transparent.

2. A preparation method of the packaging material for non-destructive detection of food quality includes the following steps:

1) preparation of the flexible base layer:
   spin-coating and heat-curing a layer of PDMS on a cleaned glass sheet to form the flexible base layer and removing the flexible base layer from the glass sheet;
2) preparation of the adhesive layer:
   subjecting the flexible base layer to plasma cleaning, spin-coating a layer of PI on the flexible base layer, and curing the PI at 200° C. for 2 h to form the adhesive layer;
3) preparation of the transparent conductive layer:
   depositing a layer of ITO with a thickness of 200 nm by sputtering on the surface of the adhesive layer to form the transparent conductive layer;
4) preparation of the nanostructured layer:

synthesizing silver nanoparticles and self-assembling the silver nanoparticles on the transparent conductive layer to form the nanostructured layer; and 5) formation of a preset meta-material pattern:
etching the adhesive layer, the transparent conductive layer, and the nanostructured layer, exclusive of the flexible base layer to form the preset meta-material pattern.

The nanostructured layer is formed by self-assembling 10-80 nm gold or silver nanoparticles.

The material of the transparent conductive layer includes, but is not limited to, ITO, graphene, carbon nanowires, and metal nanowires.

The preparation method of the transparent conductive layer includes, but is not limited to, sputtering deposition, evaporation, deposition, spin-coating, and spray-coating.

The etching technique includes, but is not limited to, photolithography, X-ray etching, electron beam etching, ion beam etching, wet etching, and laser engraving.

The PDMS of the flexible base layer has a thickness of 10-200 μm, and the PI of the adhesive layer has a thickness of 0.5-5 μm.

The material, shape, and size of the nanoparticles can be changed, and the preset meta-material pattern can be adjusted without affecting the realization of the spectral detection function.

The preset meta-material pattern is formed by multiple basic units that are arranged in an array at intervals. The basic units each include the flexible base layer, the adhesive layer, the transparent conductive layer, and the nanostructured layer which are sequentially stacked from the outer side to the inner side.

The packaging material for non-destructive detection of food quality can be used for Raman spectroscopy and terahertz spectroscopy, as well as ultraviolet spectroscopy, visible light spectroscopy, infrared spectroscopy, fluorescence spectroscopy, and hyperspectral spectroscopy.

3. A spectral imaging detection method using the packaging material for non-destructive detection of food quality includes the following steps:

S1: dripping a sample solution onto the packaging material:
preparing and dripping the sample solution onto the packaging material. Specifically, dripping the sample solution onto the nanostructured layer, and conducting drying at 60° C. to form a sample to be detected; and taking the packaging material that is not dripped with the sample solution as a reference sample.

S2: performing terahertz spectral imaging detection:
acquiring terahertz time-domain spectra of the sample to be detected and the reference sample at a humidity of less than 0.1 RH separately; calculating terahertz frequency-domain signals based on the terahertz time-domain spectra; taking a difference between reflection intensities of the sample to be detected and the reference sample at a specific frequency as a detection signal, thereby realizing amplification of a sample signal; and selecting a required detection range for terahertz imaging and determining a sample concentration and location according to the detection signal at the specific frequency.

The specific frequency means that different samples correspond to different frequencies. For example, *Pseudomonas aeruginosa* corresponds to 0.8 THz, and other sample may correspond to 0.7 THz. At the specific frequency, the sample concentration and location are determined based on the intensity of a terahertz reflection in the detection signal.

S3: performing Raman spectral imaging detection:
putting the sample to be detected on a sample stage of a Raman spectrometer; focusing, by a confocal microscope, the sample to be detected by exciting with laser light having a wavelength of 633 nm and an intensity of 0.5 mW; randomly acquiring Raman signals of 4 points for Raman spectrum detection; and adjusting the sample stage of the Raman spectrometer to a horizontal state, selecting a required detection range and step size for Raman spectral imaging, and determining a sample concentration and location based on an intensity of a Raman spectral signal.

Specifically, the sample concentration is determined based on an intensity of a Raman characteristic peak. A higher intensity of the Raman characteristic peak leads to a higher concentration of the sample, so the location of the sample can be shown in the image.

In S1, 15 μL of the sample solution is dripped each time, and the drying is performed at 60-80° C.

In S2, a time-domain signal is at a range of 30 ps, and the frequency-domain signal is at a position of 0.1-1.2 THz.

The sample solution includes, but is not limited to, *Pseudomonas aeruginosa* and pyocyanine. The *Pseudomonas aeruginosa* is detected by the Raman spectra, and the pyocyanine is detected by the terahertz spectra.

The packaging material is directly attached to the food for detection. Alternatively, a layer of edible gel is added onto the nanostructured layer of the packaging material to prevent the nanoparticles from contacting the food and affecting the detection result.

Preferably, in a specific implementation, the PDMS solution of the present disclosure may be, but is not limited to, a DC184 PDMS solution produced by Dow Corning.

The adhesive layer of the present disclosure includes, but is not limited to, polyethersulfone (PES), polyetheretherketone (PEEK), PI, or polyamideimide (PAI).

Preferably, in a specific implementation, the terahertz time-domain spectroscopy system of the present disclosure is one of model Z3 produced by z-omega.

Preferably, in a specific implementation, the Raman spectrometer of the present disclosure is one of model LABRAM HR Evolution produced by HORIBA Jobin Yvon.

In the present disclosure, the packaging material for non-destructive detection of food quality includes the nanostructured layer, the transparent conductive layer, and the flexible base layer. Ordinary packaging material has a single function and cannot amplify the spectral signal. The transparent conductive layer and the nanostructured layer can excite the corresponding resonance peaks through the surface plasmon resonance effect to enhance the interaction between the spectrum and the substance, thereby improving the spectral detection sensitivity. The outstanding advantage of the present disclosure is that the packaging material of the present disclosure can amplify the spectral signal and enable quality detection of the food inside without destroying the packaging so that the food can still be sold.

The packaging material of the present disclosure can utilize its structure to amplify the detection signal in an intact condition to realize non-destructive detection of food quality. The detection method of the present disclosure can image the packaging material, is simple and fast to operate, and is suitable for various detection needs. Thus, the packaging material of the micro-nano structure prepared by the present disclosure has the following beneficial effects.

The packaging material prepared by the present disclosure utilizes its micro-nano structure to amplify the spectral signal to realize spectral detection.

The present disclosure also utilizes the spectral transmittance characteristic of the packaging material to perform spectral detection on the food without opening the food packaging.

The packaging material prepared by the present disclosure can be used to image the food in the intact packaging through a spectrometer to determine the condition inside the packaging material.

Compared with traditional packaging material, the special packaging material prepared by the present disclosure can realize the quality detection of the packaged food, increase the function of food packaging, and greatly improve the efficiency of food detection.

Compared with ordinary spectral detection, the method of the present disclosure utilizes the meta-material structure to amplify the spectral signal, greatly improving the detection sensitivity.

The method of the present disclosure can image the packaged food, thereby ensuring the reliability of the detection result. In addition, the method of the present disclosure is simple and fast to operate and can meet the increasing demand for rapid detection.

Figure 1:
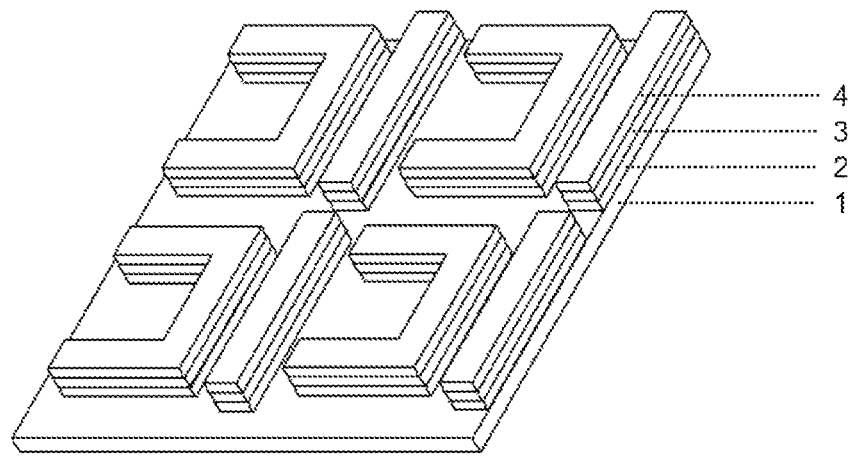
FIG. 1 is a structural diagram of a packaging material for non-destructive detection of food quality according to the present disclosure.

Reference Numerals: (1) flexible base layer; (2) adhesive layer; (3) transparent conductive layer; and (4) nanostructured layer.

DETAILED DESCRIPTION OF THE EMBODIMENTS

The present disclosure is described in further detail below with reference to an embodiment, but the present disclosure is not limited to the embodiment.

The embodiment of the present disclosure is described below.

Embodiment 1

(1) Preparation of a Flexible Base Layer

A flat quartz wafer or silicon wafer is ultrasonically cleaned in acetone, ethanol, and water for 5 min, respectively, and is then dried. PDMS is spin-coated on the surface of the quartz or silicon wafer and is heat-cured to form the flexible base layer.

(2) Preparation of an Adhesive Layer

PI is spin-coated on the surface of the flexible base layer and is heat-cured to form the adhesive layer for bonding the flexible base layer and a transparent conductive layer.

(3) Preparation of the Transparent Conductive Layer 200 nm ITO is evaporated on the PI to form the transparent conductive layer.

(4) Preparation of a Nanostructured Layer 43 nm silver nanocubes are synthesized, and a 0.1 mg/mL solution of polyethylene glycol compound with sulfhydryl groups (PEG-SH) in chloroform is prepared. A silver nanocube solution, the PEG-SH chloroform solution, and a methanol solution are thoroughly mixed at a volume ratio of 1; 1:1. The mixture is centrifuged at 8,000 rpm for 15 min. A supernatant is discarded, and a precipitate is re-dissolved to one-third of its original size with a chloroform solution. Centrifuging is performed at 8,000 rpm for 15 min. A supernatant is discarded, and a precipitate is re-dissolved to one-third of its original size with a chloroform solution. Centrifuging is performed at 8,000 rpm for 15 min. A supernatant is discarded, and a precipitate is re-dissolved to one-tenth of its original size with a chloroform solution. The resulting mixture is slowly injected onto a surface of an aqueous solution by a syringe at a rate of 0.4 mL/min. Tension at the water surface is monitored by a Langmuir-Blodgett (LB) film analyzer, and a uniform and dense monolayer of the silver nanocube is completely transferred to the surface of the transparent conductive layer. The silver nanocube layer serves as the nanostructured layer to amplify the Raman signal.

(5) Preparation of a Meta-Material Structure

The adhesive layer, the transparent conductive layer, and the nanostructured layer are etched into the desired pattern. The structure of the packaging material is shown in FIG. 1.

(6) Acquisition of *Pseudomonas aeruginosa* Solution and its Secretion Pyocyanine 1 mL of *Pseudomonas aeruginosa* cultured for 12 h is taken. In this embodiment, $OD_{600}=1$.

(7) Dripping of the *Pseudomonas aeruginosa* Solution onto the Surface of the Packaging Material 15 μL of the *Pseudomonas aeruginosa* solution is dripped onto the surface of the packaging material and drying is performed at 60° C. The above steps are repeated three times to obtain three sample points to be detected. The detection area of each sample point to be detected is about 20 mm$^2$, and three reference sample points (packaging material only, not dripped) are provided.

(8) Acquisition of Terahertz Time-Domain Spectra of the Sample Points to be Detected and the Reference Sample Points on the Surface of the Packaging Material A power box and a computer of a terahertz time-domain system are started, and an acquisition board and a delay line switch are turned on. Control software of the terahertz time-domain system is opened to set a delay line resolution to 0.5 um, a delay line speed level to 2, a start position of a delay line range to 50,000, and an end position to 40,000. A laser power supply is turned on to start the signal acquisition. The packaging material is put on a sample holder for detection, and the terahertz time-domain system is filled with nitrogen to reduce the internal humidity to less than 0.1% for detection. The terahertz time-domain spectra of the sample points to be detected and the reference sample points on the same multi-scale meta-material in the range of 0.1-2 THz are acquired at the humidity of less than 0.1%, and the terahertz time-domain spectra of the reference points are acquired. The terahertz time-domain spectrum of each sample point is acquired according to the above method, and a terahertz time-domain spectrum data set of all sample points is acquired. The terahertz time-domain signal of the sample point is converted into a frequency-domain signal through a fast Fourier transform, and the reflectance of the sample point to be detected is acquired through the frequency-domain signal. An intensity corresponding to a maximum value of an absorption peak is calculated, and the intensity value of the sample point to be detected is subtracted from the intensity value of the reference sample point to obtain a change in the intensity of the absorption peak.

Figure 2:
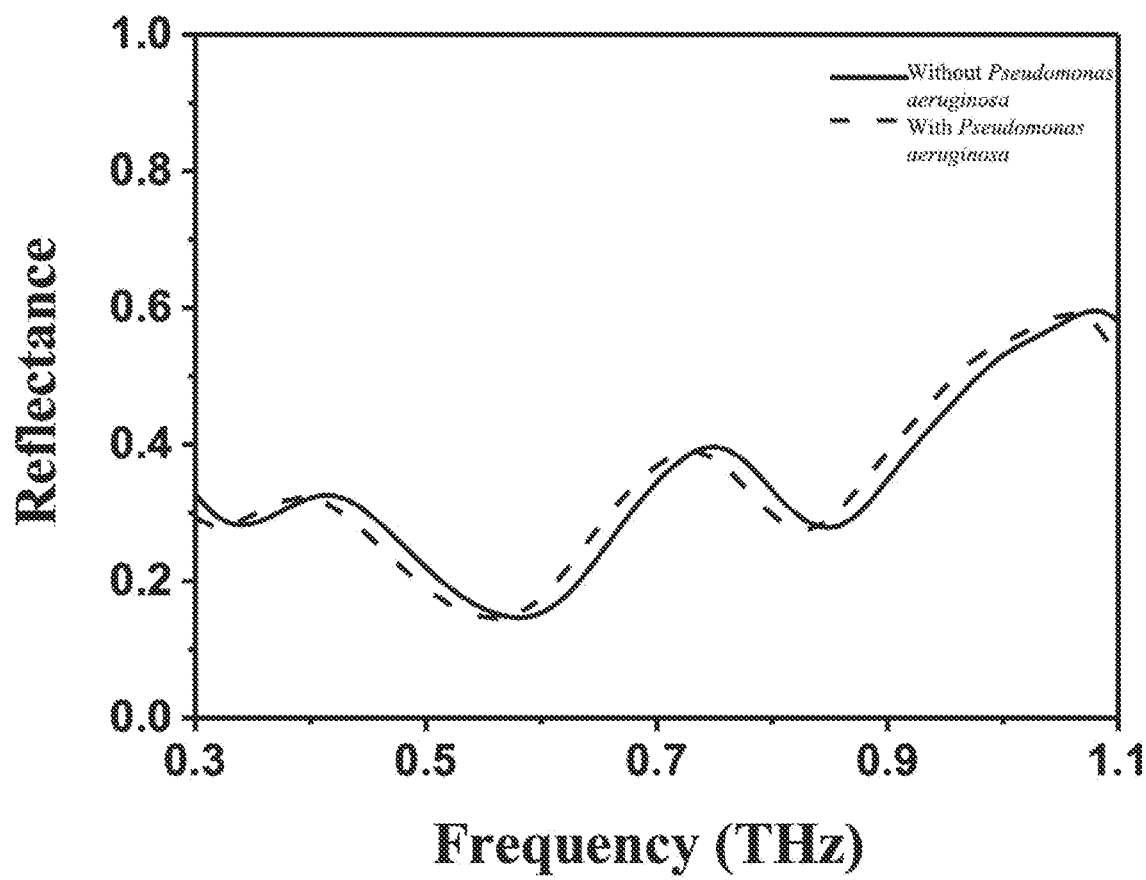
FIG. 2 shows terahertz spectra of the packaging material for non-destructive detection of food quality in the presence and absence of *Pseudomonas aeruginosa* according to Embodiment 1 of the present disclosure.

FIG. 2 shows the absorption spectra of the packaging material for non-destructive detection of food quality in the presence and absence of *Pseudomonas aeruginosa*.

Figure 3:
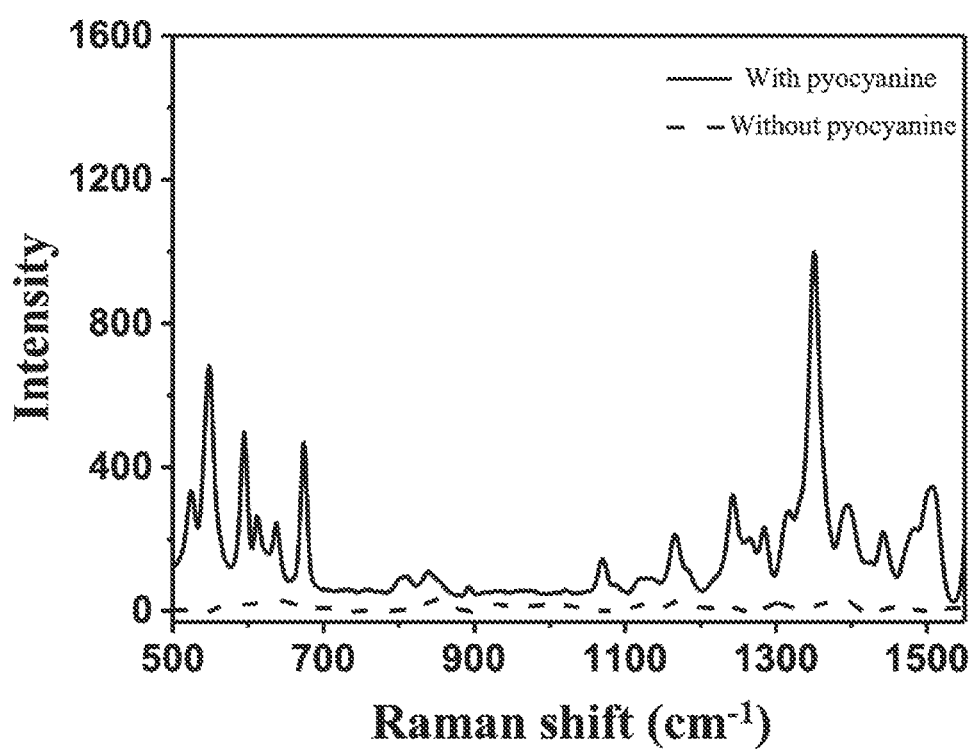
FIG. 3 shows Raman spectra of the packaging material for non-destructive detection of food quality in the presence and absence of pyocyanine according to Embodiment 1 of the present disclosure.

(7) Acquisition of Raman Spectral Signals of Pyocyanine on the Surface of the Packaging Material for Non-Destructive Detection of Food Quality Pyocyanine is dripped onto the packaging material for non-destructive detection of food quality. The laser intensity is adjusted, the sample is adjusted to a horizontal state, and the Raman spectra of the sample points to be detected on the packaging material for non-destructive detection of food quality are acquired, respectively. The Raman spectra of the packaging material for non-destructive detection of food quality in the presence and absence of pyocyanine are shown in FIG. 3.

In conclusion, the packaging material prepared by the method of the present disclosure has a micro-nano structure, so the packaging material can be used for spectral detection, and the quality of the packaged food can be detected without opening the package. The packaging material features high flexibility, high sensitivity, and fast and convenient detection. The present disclosure further develops a related spectral imaging method, which is simple and fast to operate and satisfies the increasing detection needs. The above specific implementations are intended to explain the present disclosure, rather than to limit the present disclosure. Within the spirit of the present disclosure and the protection scope of the claims, any modification and change to the present disclosure should fall into the protection scope of the present disclosure.

What is claimed is:

1. A packaging material for a non-destructive detection of food quality, comprising a film material covering an outside of food, wherein the film material comprises a flexible base layer, an adhesive layer, a transparent conductive layer, and a nanostructured layer, wherein the flexible base layer the adhesive layer the transparent conductive layer, and the nanostructured layer are sequentially stacked from an outer side to an inner side; the flexible base layer is a polydimethylsiloxane (PDMS) layer; the adhesive layer is a polyimide (PI) layer; the transparent conductive layer is an indium tin oxide (ITO) layer; and the nanostructured layer is a silver nanoparticles layer.

2. The packaging material according to claim 1, wherein a layer of PI is spin-coated on the flexible base layer made of the PDMS, and a layer of ITO film is sputtered on the PI to form the transparent conductive layer; nanoparticles are self-assembled on the transparent conductive layer to form the nanostructured layer; and the transparent conductive layer and the nanostructured layer are configured to amplify a spectral signal to realize the non-destructive detection of food quality.

3. The packaging material according to claim 1, wherein the flexible base layer, the adhesive layer, and the transparent conductive layer are transparent.

4. A preparation method of the packaging material according to claim 1, comprising the following steps:
1) A preparation of the flexible base layer:
spin-coating and heat-curing a layer of PDMS on a cleaned glass sheet to form the flexible base layer and removing the flexible base layer from the glass sheet;
2) a preparation of the adhesive layer:
subjecting the flexible base layer to a plasma cleaning, spin-coating a layer of PI on the flexible base layer, and curing the PI at 200° C. for 2 h to form the adhesive layer;
3) a preparation of the transparent conductive layer:
depositing a layer of ITO with a thickness of 200 nm by sputtering on a surface of the adhesive layer to form the transparent conductive layer;
4) a preparation of the nanostructured layer:
synthesizing silver nanoparticles and self-assembling the silver nanoparticles on the transparent conductive layer to form the nanostructured layer; and
5) a formation of a meta-material pattern:
etching the adhesive layer, the transparent conductive layer, and the nanostructured layer according to a preset meta-material pattern to form a designed pattern.

5. The preparation method of the packaging material according to claim 4, wherein
the nanostructured layer is formed by self-assembling 10-80 nm gold or silver nanoparticles.

6. The preparation method of the packaging material according to claim 4, wherein the PDMS of the flexible base layer has a thickness of 10-200 μm, and the PI of the adhesive layer has a thickness of 0.5-5 μm.

7. The preparation method of the packaging material according to claim 4, wherein the preset meta-material pattern is formed by a plurality of basic units, wherein the plurality of basic units are arranged in an array at intervals; and the plurality of basic units each comprise the flexible base layer, the adhesive layer, the transparent conductive layer, and the nanostructured layer.

8. A spectral imaging detection method using the packaging material according to claim 1, comprising the following steps:
S1: dripping a sample solution onto the packaging material:
preparing and dripping the sample solution onto the packaging material; wherein dripping the sample solution onto the nanostructured layer and conducting a drying at 60° C. to form a sample to be detected; and taking a packaging material as a reference sample, wherein the packaging material is not dripped with the sample solution;
S2: performing a terahertz spectral imaging detection:
acquiring terahertz time-domain spectra of the sample to be detected and the reference sample at a humidity of less than 0.1 RH separately; calculating terahertz frequency-domain signals based on the terahertz time-domain spectra; taking a difference between reflection intensities of the sample to be detected and the reference sample at a specific frequency as a detection signal; and selecting a required first detection range for a terahertz imaging, and determining a first sample concentration and location according to the detection signal at the specific frequency; and
S3: performing a Raman spectral imaging detection:
putting the sample to be detected on a sample stage of a Raman spectrometer; focusing, by a confocal microscope, the sample to be detected by exciting with a laser light having a wavelength of 633 nm and an intensity of 0.5 mW; randomly acquiring Raman signals of 4 points for a Raman spectrum detection; and adjusting the sample stage of the Raman spectrometer to a horizontal state, selecting a required second detection range and step size for a Raman spectral imaging, and determining a second sample concentration and location based on an intensity of a Raman spectral signal.

9. The spectral imaging detection method using the packaging material according to claim 8, wherein in S1, 15 μL of the sample solution is dripped each time, and the drying is performed at 60-80° C.

10. The spectral imaging detection method using the packaging material according to claim 9, wherein the packaging material is directly attached to the food for detection; or a layer of edible gel is added onto the nanostructured layer of the packaging material to prevent nanoparticles from contacting the food and affecting a detection result.

* * * * *